(12) United States Patent
Veitch et al.

(10) Patent No.: US 8,171,625 B1
(45) Date of Patent: May 8, 2012

(54) METHOD OF PROVIDING LOW FOOTPRINT OPTICAL INTERCONNECT

(75) Inventors: Randall C. Veitch, Nazareth, PA (US); Thomas W. Stone, Hellertown, PA (US)

(73) Assignee: Wavefront Research, Inc., Bethlehem, PA (US)

( * ) Notice: Subject to any disclaimer, the term of this patent is extended or adjusted under 35 U.S.C. 154(b) by 0 days.

(21) Appl. No.: 12/477,046

(22) Filed: Jun. 2, 2009

Related U.S. Application Data

(60) Provisional application No. 61/057,996, filed on Jun. 2, 2008.

(51) Int. Cl.
*H05K 3/34* (2006.01)
(52) U.S. Cl. ......... 29/840; 29/592.1; 29/825; 372/43.01
(58) Field of Classification Search ............ 29/825, 29/832, 840; 372/43.01
See application file for complete search history.

(56) References Cited

U.S. PATENT DOCUMENTS

| | | | | |
|---|---|---|---|---|
| 5,226,052 | A * | 7/1993 | Tanaka et al. | 372/36 |
| 5,302,778 | A * | 4/1994 | Maurinus | 174/521 |
| 5,812,582 | A * | 9/1998 | Gilliland et al. | 372/50.21 |
| 6,170,996 | B1 * | 1/2001 | Miura et al. | 385/94 |
| 6,195,261 | B1 * | 2/2001 | Babutzka et al. | 361/752 |
| 6,384,397 | B1 * | 5/2002 | Takiar et al. | 250/208.1 |
| 6,592,238 | B2 * | 7/2003 | Cleaver et al. | 362/246 |
| 6,863,453 | B2 * | 3/2005 | Wang et al. | 385/94 |
| 7,214,919 | B2 * | 5/2007 | Boemler | 250/208.1 |
| 7,655,507 | B2 * | 2/2010 | Derderian et al. | 438/116 |
| 7,786,574 | B2 * | 8/2010 | Derderian et al. | 257/724 |
| 7,858,420 | B2 * | 12/2010 | Derderian et al. | 438/48 |
| 2008/0173792 | A1 * | 7/2008 | Yang et al. | 250/208.1 |

* cited by examiner

*Primary Examiner* — Carl Arbes
(74) *Attorney, Agent, or Firm* — Burns & Levinson LLP; Jacob N. Erlich; Orlando Lopez

(57) ABSTRACT

Compact ASIC, chip-on-board, flip-chip, interposer, and related packaging techniques are incorporated to minimize the footprint of optoelectronic interconnect devices, including the Optical Data Pipe. In addition, ruggedized packaging techniques are incorporated to increase the durability and application space for optoelectronic interconnect devices, including an Optical Data Pipe.

12 Claims, 22 Drawing Sheets

Detailed cross section of BBODP Construction.

METHOD OF PROVIDING LOW FOOTPRINT OPTICAL INTERCONNECT

CROSS REFERENCE TO RELATED APPLICATIONS

This application claims priority to U.S. Provisional Application Ser. No. 61/057,996, filed Jun. 2, 2008, entitled LOW FOOTPRINT OPTICAL INTERCONNECTS, which is incorporated herein by reference in its entirety.

STATEMENT OF FEDERALLY SPONSORED RESEARCH OR DEVELOPMENT

This invention was made with U.S. Government support from the U.S. Air Force under contract #F30602-03-C-0213 and from the U.S. Air Force under contract #FA8750-04-C-0250. The U.S. Government has certain rights in the invention.

BACKGROUND

These teachings relate generally to compact alignment tolerant optical interconnects, and, more particularly to small footprint and ruggedly packaged optoelectronic devices.

In the optical interconnect system or optical data pipe approach of U.S. Pat. No. 7,015,454, mating emitter and detector arrays are pre-aligned and fixed on or near the ends of a gradient index rod imager, and this flexible pre-aligned structure is then mounted to the host. Using this technology hundreds or thousands of high bandwidth channels can be interconnected for short distances (intra-die, between neighboring chips or MCMS) or over relatively long distances (full board wrap-around, board-to-board, computer to peripheral, computer to computer, etc.). The optical interconnect system of U.S. Pat. No. 7,015,454 provides a nearly lossless one-to-one optical interconnection from a set of input channels to a set of output channels, and supports extreme density, low power, and low crosstalk for high bandwidth signals.

The system of U.S. Pat. No. 7,015,454 can be pre-aligned and fixed during manufacture (e.g., using automated alignment and cementing procedures) to produce optical interconnects that have relaxed alignment tolerances and are thus readily usable in the field by non-optical personnel. The interconnection systems of U.S. Pat. No. 7,015,454 are tolerant of handling, bending and displacements among interconnected components without losing their function of interconnecting many closely packed (dense) optical channels. However, the utility of interconnection systems of U.S. Pat. No. 7,015,454 would be increased if the interconnection systems could be provided in a low footprint package.

SUMMARY

Compact ASIC, chip-on-board, flip-chip, interposer, and related packaging techniques are incorporated to minimize the footprint of optoelectronic interconnect devices, including the Optical Data Pipe. In addition, ruggedized packaging techniques are incorporated to increase the durability and application space for optoelectronic interconnect devices, including the Optical Data Pipe.

For a better understanding of the present teachings, together with other and further objects, reference is made to the following description taken in conjunction with the accompanying drawings, and its scope will be pointed out in the appended claims.

DETAILED DESCRIPTION

A desirable Optical Data Pipe (ODP) low footprint package is the low footprint chip-on-board ODP. Low footprint packaged devices such as these are important for optoelectronic device applications such as the Optical Data Pipe technology of U.S. Pat. No. 7,015,454, which is incorporated by reference herein its entirety, because novel packaging is required to deliver the tiny footprint potential of such technologies. The optical data pipe technology is described further in detail in U.S. Pat. No. 7,015,454 and related cases.

Figure 1:
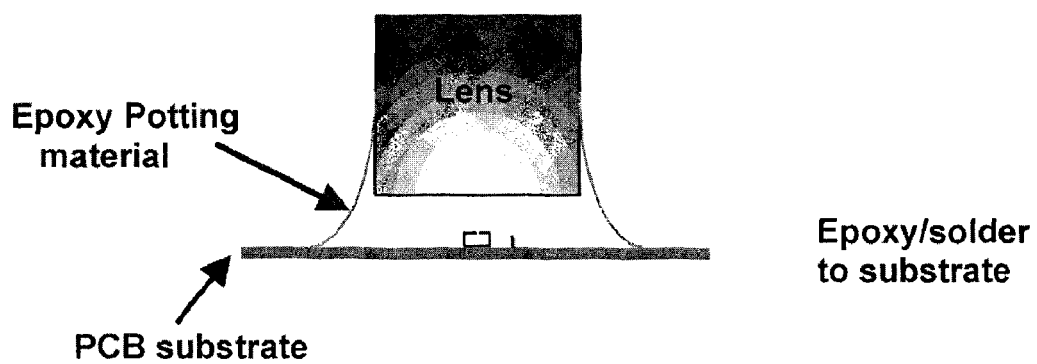
FIG. 1 is a cross-sectional view of an embodiment of the system of these teachings.

In this embodiment, the transceiver die are bonded (e.g., using solder bump-bonding techniques) directly to the circuit board. (Transceiver die as used herein refers to an optoelectronic die including emitter dies, detector dies, receiver dies and emitter/detector/receiver dies.) The infinite conjugate imagers may then be aligned and affixed directly to the board also, eliminating the increase in ODP footprint that is often caused by carriers or submounts. This Chip-On-Board embodiment is illustrated schematically in FIG. 1.

Figure 2:
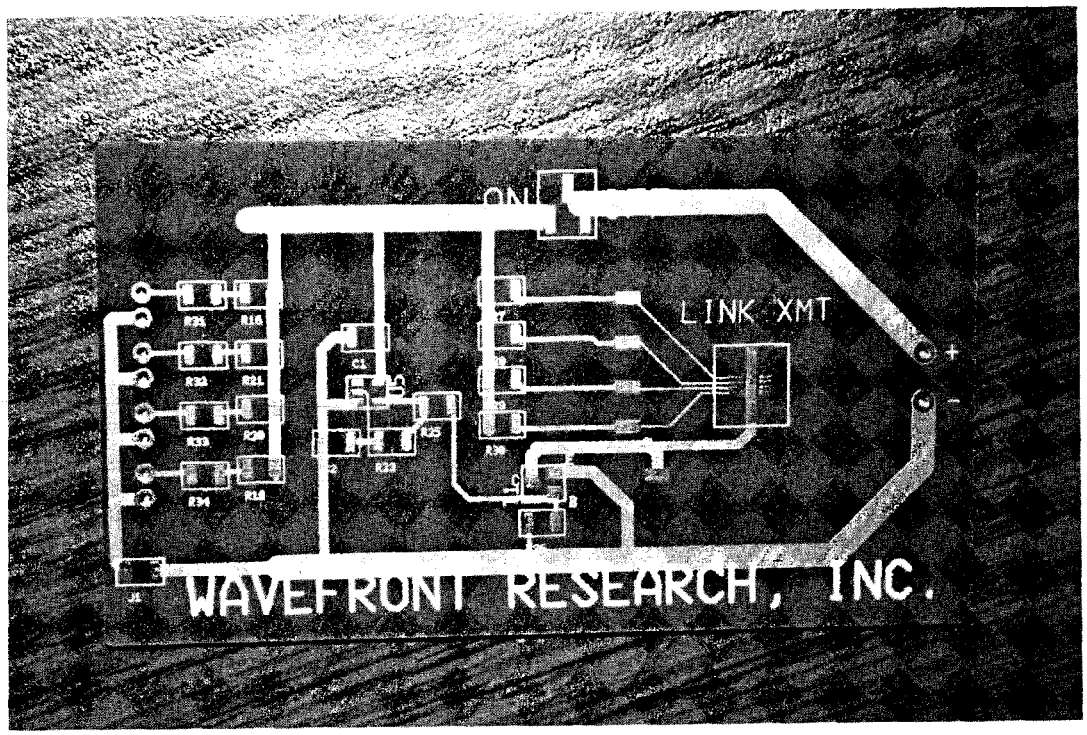
FIG. 2 is an illustration of a circuit board of an embodiment of the system of these teachings.

Because of the importance of this high performance Chip-On-Board (COB) ODP packaging technique and its tiny footprint potential, it was explored experimentally. An unpopulated circuit board designed for COB ODP packaging is illustrated in FIG. 2. This die is to be mounted in the white square region in the right of the photograph of FIG. 2. This photograph shows the unpopulated circuit board that was designed for a Hand-Held BB-ODP Feasibility Demonstrator.

Figure 3:
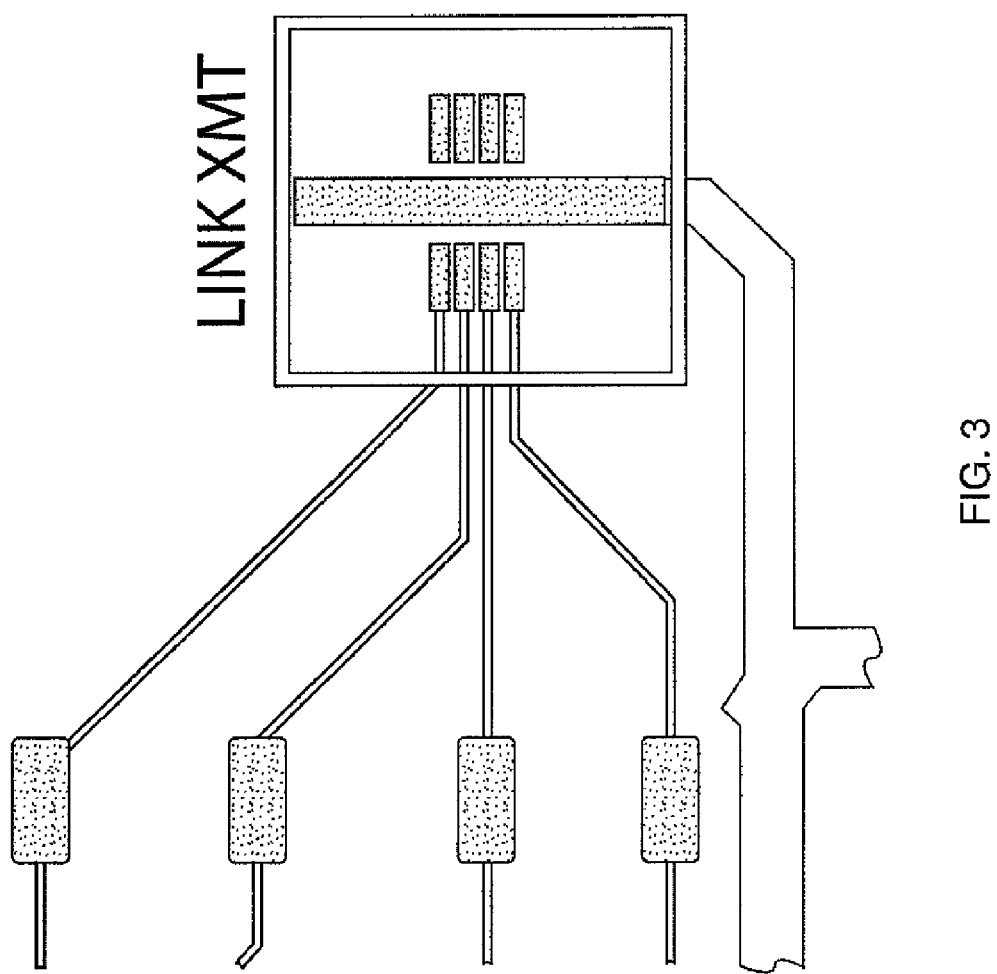
FIG. 3 is a close-up of the photographic illustration of a circuit board of an embodiment of the system of these teachings.

A magnified view of this die bonding area is illustrated in FIG. 3. Here the bonding conductor for the die can be seen next to the bonding pads for the optoelectronic devices. This board was used for the 4-channel Hand-Held BB-ODP Feasibility Demonstrator.

Figure 4:
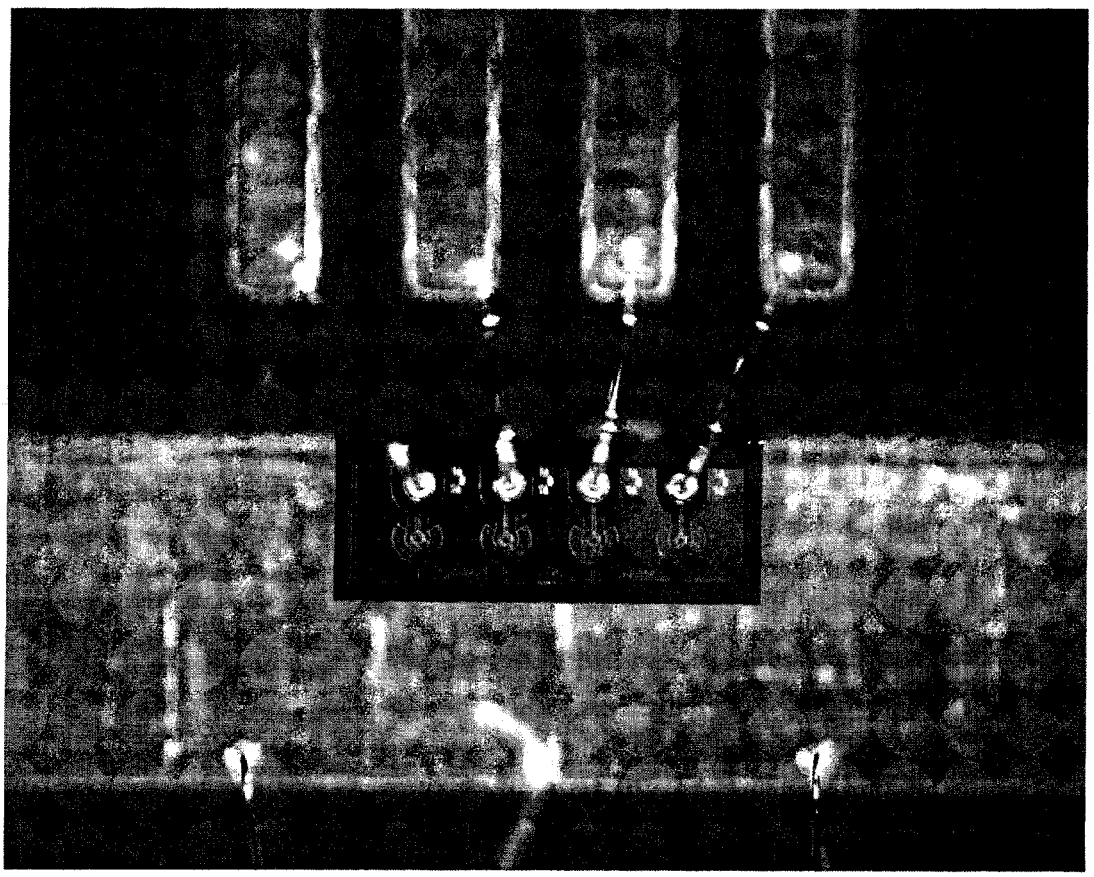
FIG. 4 is an illustration of a packaging technique of an embodiment of the system of these teachings.

A photomicrograph of the VCSEL die bonded to the board in this COB packaging technique is given in FIG. 4. In this photomicrograph the die is bonded to the substrate conductor, and 4 wire bonds are seen connecting each of the VCSEL devices to the respective board traces.

Figure 5:
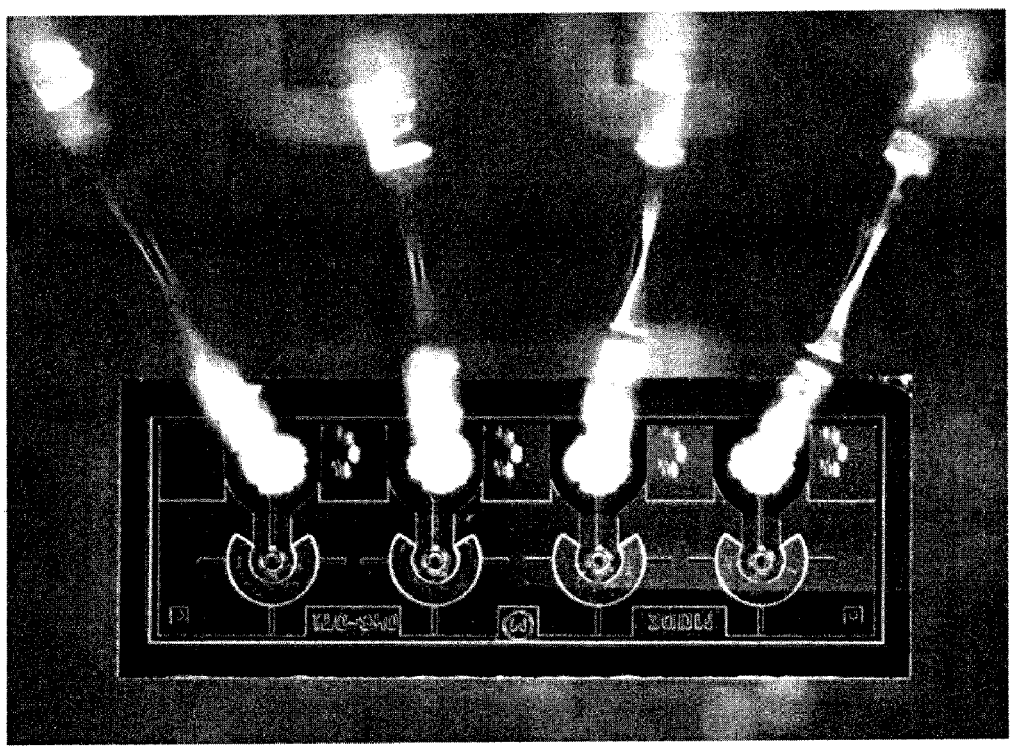
FIG. 5 is a detailed illustration of an on-board die of an embodiment of the system of these teachings.
Figure 6:
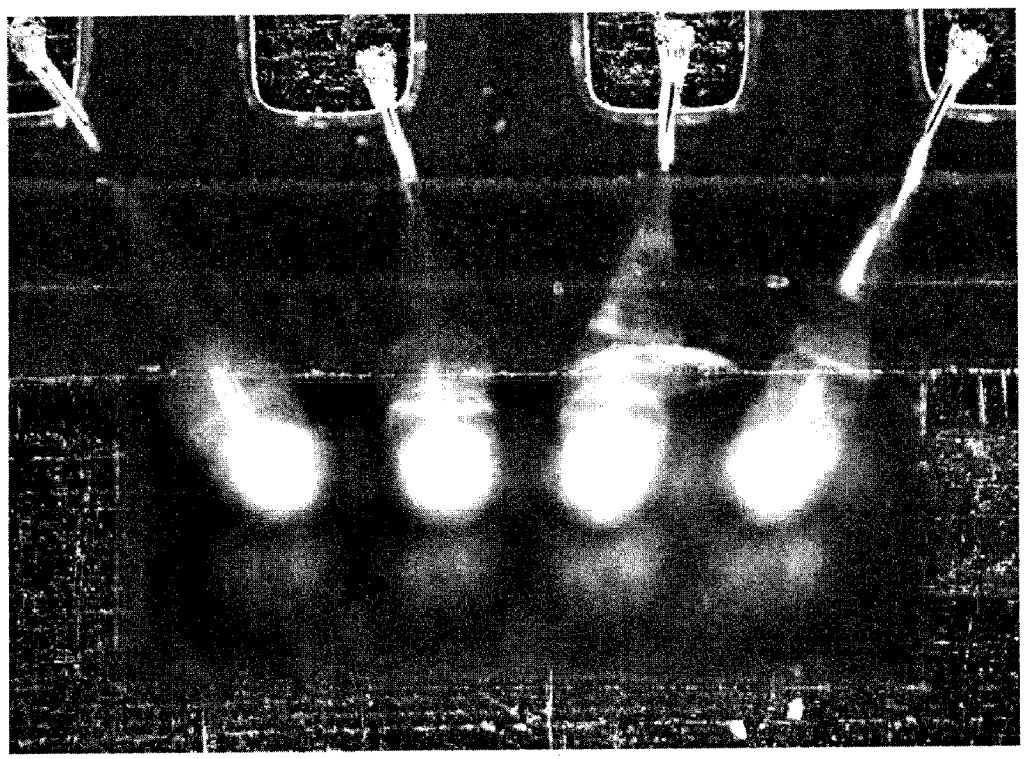
FIG. 6 is another detailed illustration of an on-board die of an embodiment of the system of these teachings.

A pair of more detailed photomicrographs of this on-board die is given in FIGS. 5 and 6. In FIG. 5 the photomicrograph was focused on the die surface. The blurred board traces and wire bonds are visible in the background. In FIG. 6, the photomicrograph was focused on the board surface. Here the die surface is blurred and the board level is sharply imaged. The four wire bonds and the bond traces are clearly visible.

Figure 7:
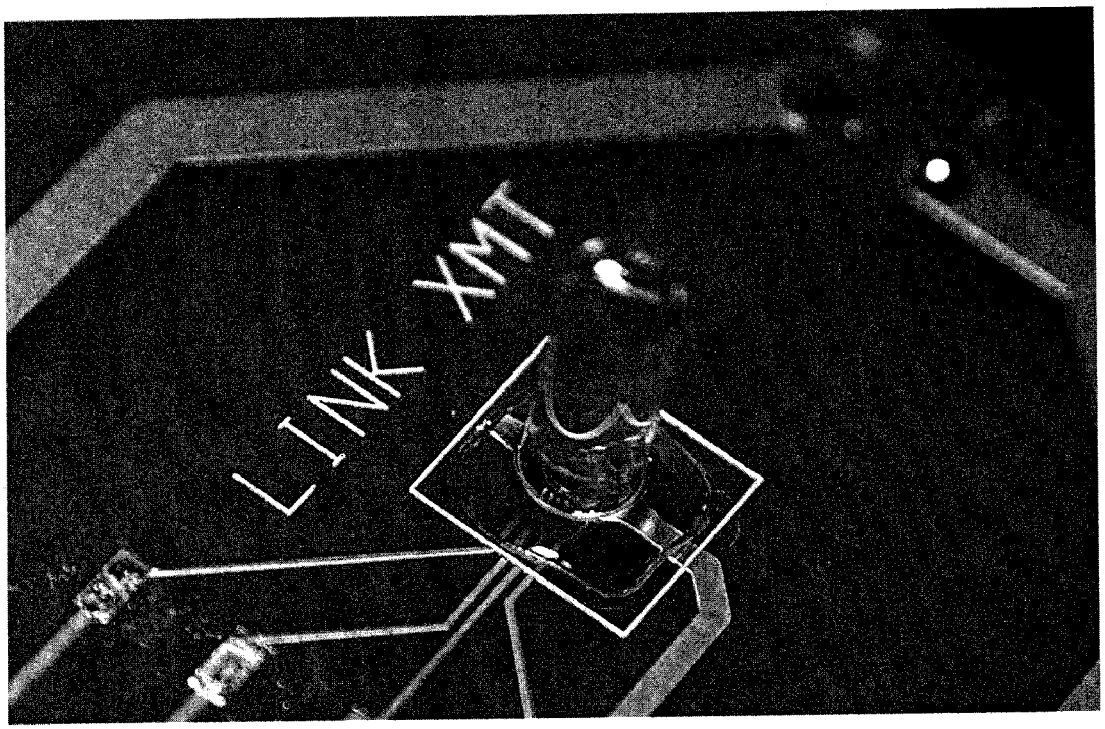
FIG. 7 is an illustration of a step of an embodiment of the method of these teachings.

In the COB ODP packaging technique, after the die are bonded to the board as shown above, the infinite conjugate imager (rod lens in this case) is aligned and affixed to the board. A photomicrograph of this step is shown in FIG. 7. The infinite conjugate imager is aligned and affixed to the circuit board in the final step of the COB ODP packaging. The imager shown is capable of coupling more than 100 channels from board-to-board when more advanced optoelectronics is used. The footprint of the ODP module can be as small as that of the rod lens itself.

These ODP modules can be intermittently placed across circuit boards as dataflow dictates and each is implemented with very low board footprints (much lower than conventional connectors).

A Board-To-Board Optical Data Pipe (BB-ODP) feasibility demonstrator was built to demonstrate the low footprint devices. The first step in the feasibility demonstrator fabrication was the fabrication of BB-ODP modules. A custom carrier substrate had to be fabricated to facilitate handling and alignment of the optical element devices. Initially, placement and die location inside the Small Outline Integrated Circuit (SOIC) carriers was of great concern. To assist in this matter a grid of lines was to be laser engraved into the carrier substrate's metallization. These lines then could be used as reference edges by the assembly operator for die placement.

A circuit was designed on a ceramic thick-film substrate that would also serve as the VCSEL/PIN die carrier. Built into the design were elements to assist an assembly operator in an ideal die placement. This path has additional benefits as well. These include a low profile with respect to the populated circuit board (PCB), and now the ability to pre-pot the lens onto the die as a subassembly. This should increase WRI's working yield of BB-ODP modules before attach to the PCB.

Figure 8:
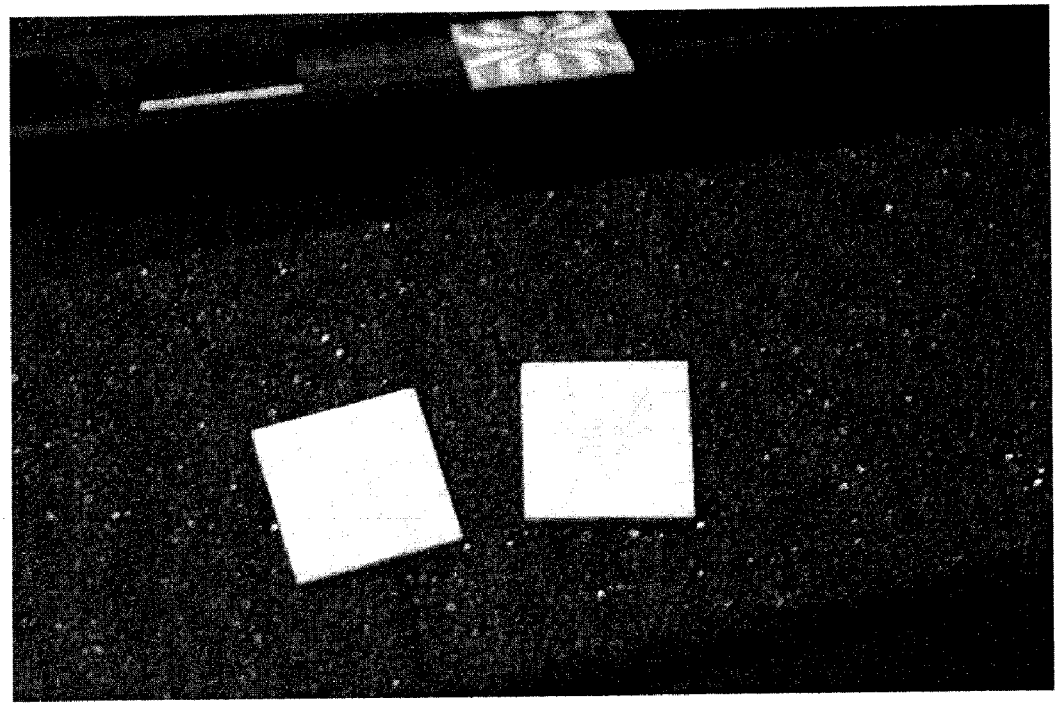
FIG. 8 is an illustration of a sub-circuit substrate of an embodiment of the system of these teachings.

A thick-film ceramic process was chosen for this purpose with the goal of maintaining a low profile of the die/lens assembly to the PCB. FIG. 8 is an illustration of this sub-circuit substrate, which acts as an assembly base for the BB-ODP die/lens assembly. Measuring just 0.4 inches to a side this printed ceramic substrate, or interposer, will serve as the carrier base for the active optical elements, VCSEL and PIN arrays, and lens assembly of the BB-ODP. The circuit traces are of wire-bondable gold with a palladium silver overlay at the edges for solderability.

Figure 9:
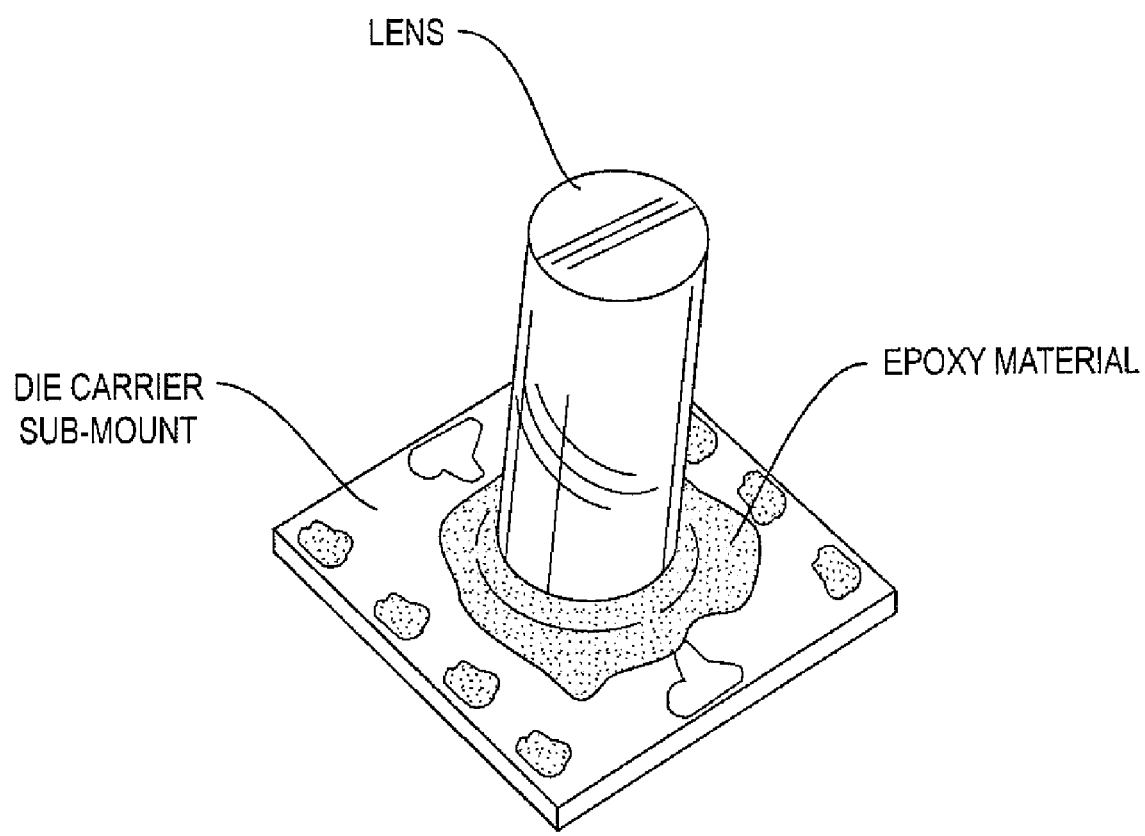
FIG. 9 is an illustration of a prototype of an embodiment of the system of these teachings.

The first 4 channel ODP prototypes fabricated and tested are shown in FIG. 9. The device functionality and basic performance characteristics were evaluated, and their performance is described in later sections of this report. The transmit modules are dyed red for identification. Similarly, the receive modules are dyed blue. Each of these modules contained 4 independent data channels. FIG. 9 shows the first BB-ODP transmit and receive modules fabricated in this effort. The blue module is a 4 channel BB-ODP receiver and the red module is a 4 channel BB-ODP transmit module. The basic structural components are labeled.

The next step toward the demonstration of the BB-ODP feasibility at 125 MHz in the SIMD application was design and fabrication of the printed circuit boards. A first level prototype of transmit and receive circuits for the printed circuit boards to be used in a demonstration of the BBODP concept was completed. Of interest were low power operation of a VCSEL at 125 MHz data rate and the operation of a detector and amplifier also working at 125 MHz.

Figure 10:
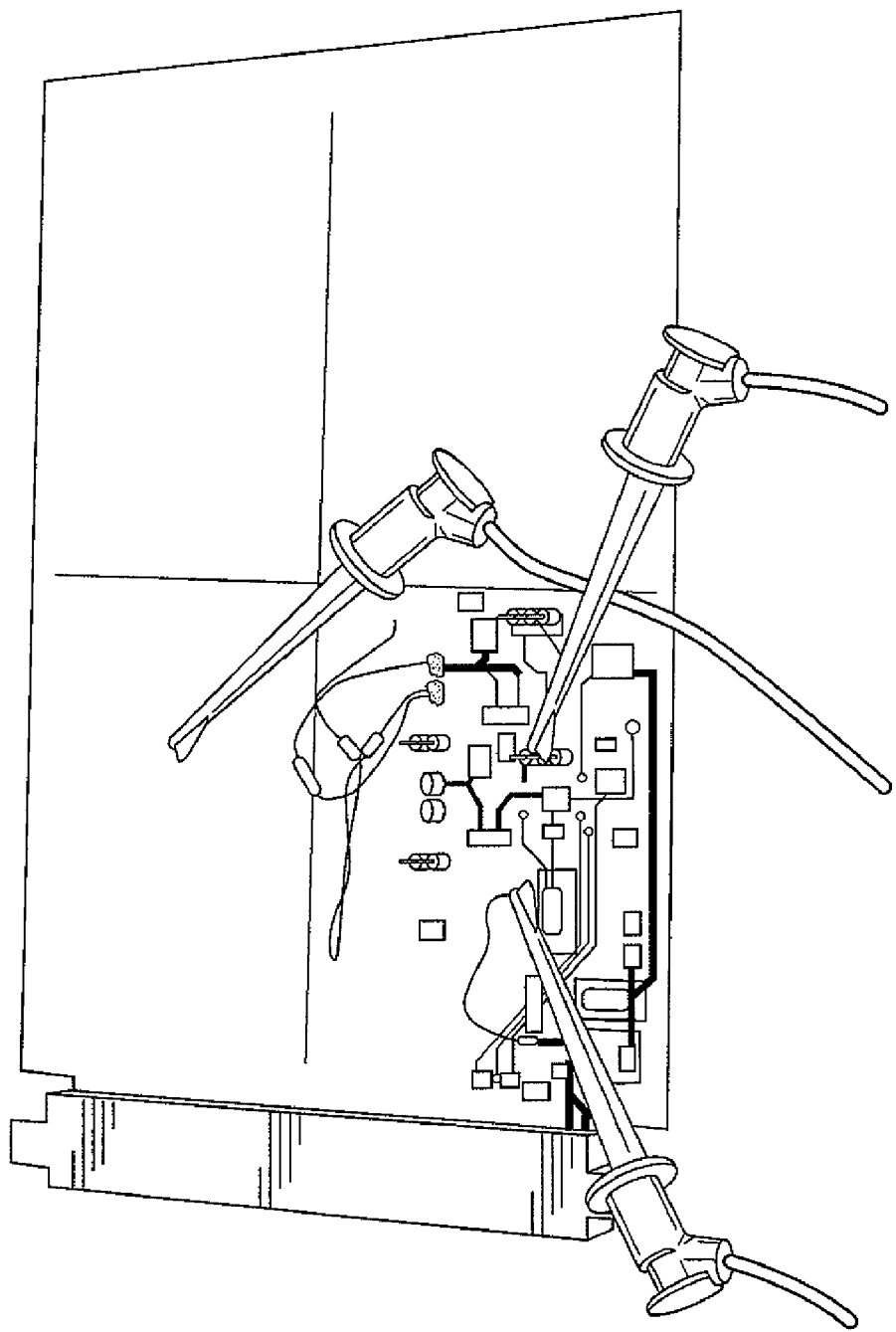
FIG. 10 is an illustration of a first level prototype assembly of an embodiment of the system of these teachings.

A first level prototype assembly of the electronic circuits is shown in FIG. 10. Illustrated in FIG. 10 is a first prototype assembly of a VCSEL driver circuit and an amplified receiver circuit for the demonstration PCBs. The upper left of the circuit board is an experimental amplifier for a PIN detector. The circuit in the lower portion of the PCB is a driver circuit for a VCSEL.

Surface mount components were used to minimize high frequency parasitics. The high data rate, 125 MHz, provides a significant challenge in the detector amplifier and PCB layout criteria. A number of prototype revisions were needed since parasitic issues are solved in part by trial and error.

Figure 11:
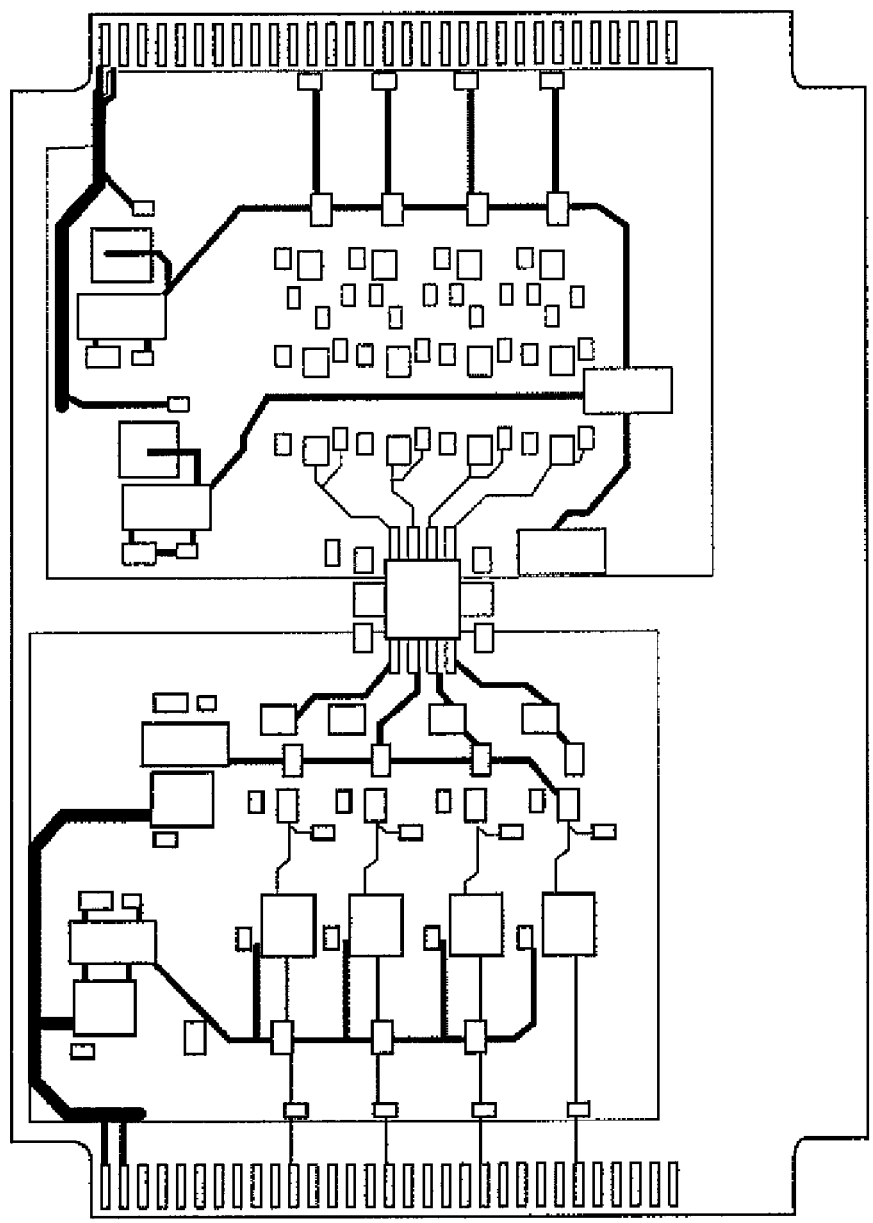
FIG. 11 an illustration of a populated circuit board of an embodiment of the system of these teachings.

FIG. 11 shows a 1st generation four channel PCB and will be the first to be tested with the BB-ODP mounted directly to the board. After a component population of two of these PCBs it was discovered that the PCBs themselves had a defect. The defect in these first generation boards was in the feed through vias that connect top layer conductors to bottom layer conductors. A replacement board was made and evaluated.

FIG. 11 illustrates a 1st generation, four channel PCB for evaluation of test Signals at 125 MHz. This new printed circuit board is not yet populated with components as shown. It was designed with efficiency in mind by combining send and receive circuits on the same board and populating only the half that supported the desired function. The left side contains a circuit layout for four send channels and the right side contains a circuit layout for four receive channels. The pad array in the center accommodates either a send or receive BB-ODP module.

Figure 12:
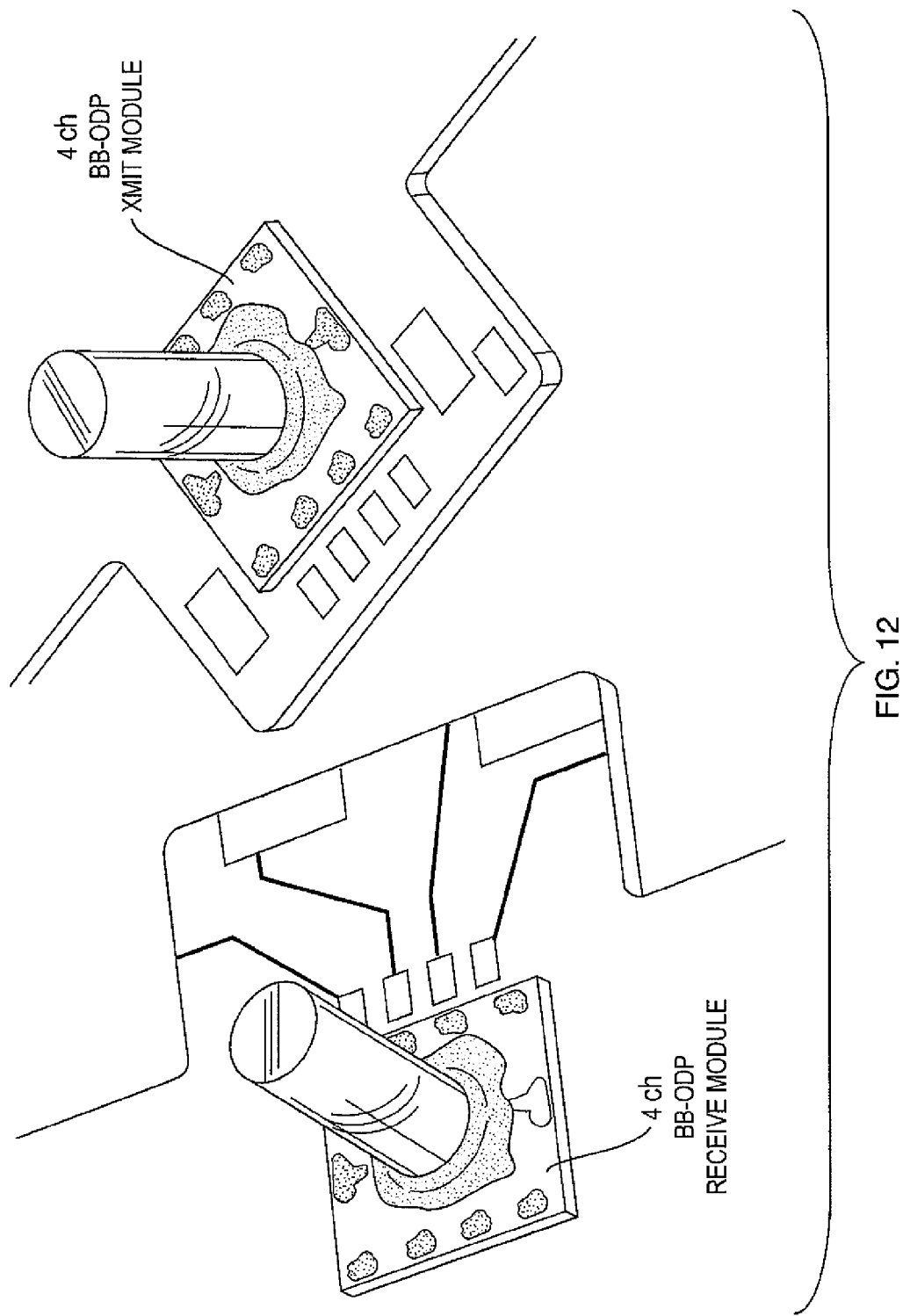
FIG. 12 is an illustration of a pair of populated circuit boards of an embodiment of the system of these teachings.

The BB-ODP transmit and receive printed circuit boards were populated with corresponding BB-ODP modules. A photograph of the pair of populated circuit boards is illustrated in FIG. 12. These printed circuit boards are the latest of several revisions. The BB-ODP transmit and receive modules are mounted on their respective circuit boards for testing.

Figure 13:
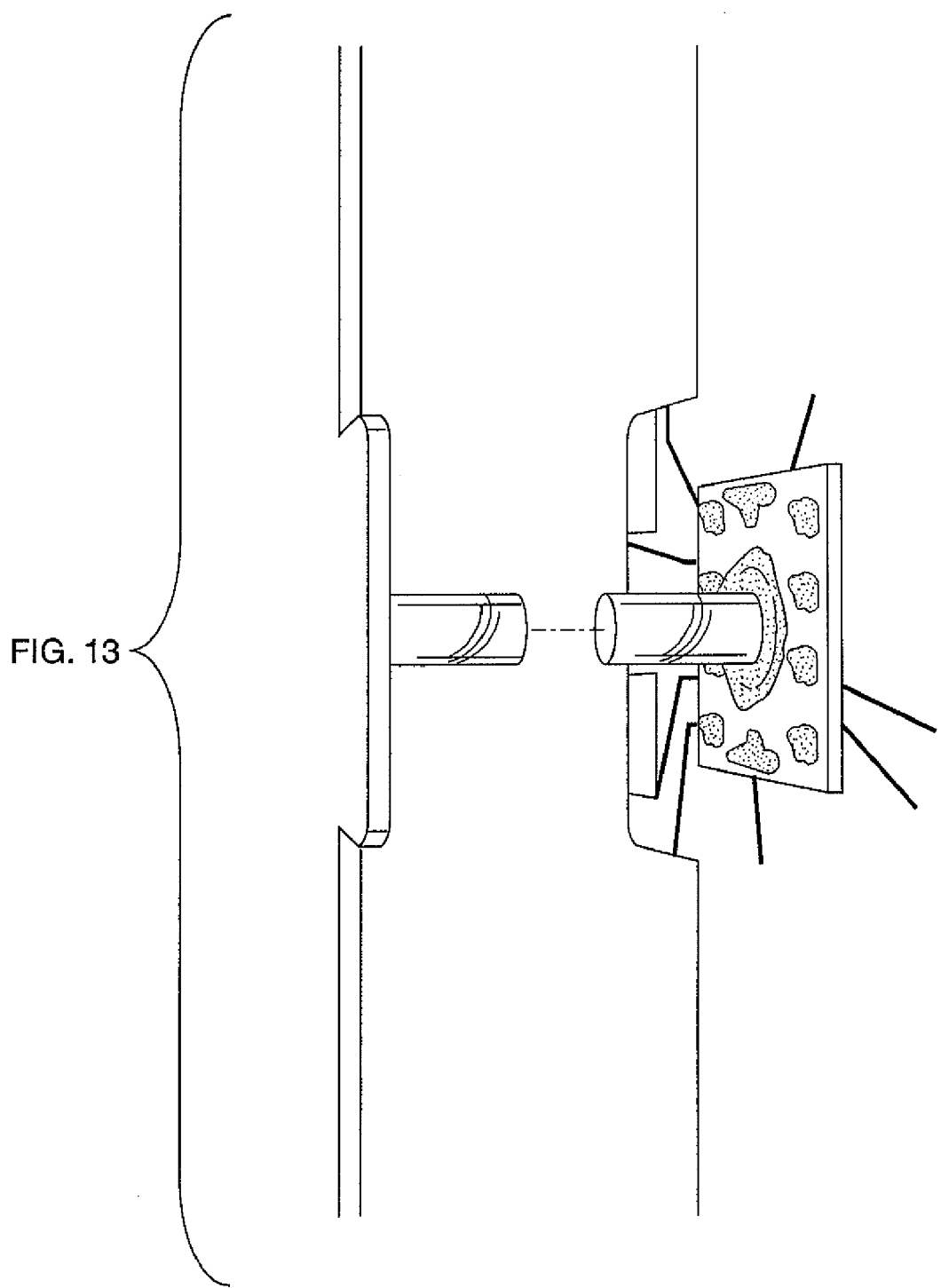
FIG. 13 is an illustration of the two circuit boards of FIG. 12 with transmit and receive modules aligned.

These circuit boards were then mounted face-to-face, and the feasibility experiment was performed. FIG. 13 includes a photograph of the two circuit boards with transmit and receive modules aligned and operating in the 125 MHz BB-ODP feasibility demonstration experiment. Data from this experiment was collected.

Figure 14:
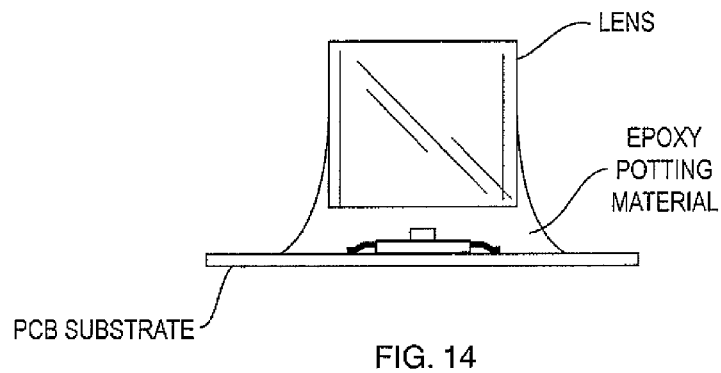
FIG. 14 is a schematic of a packaging technique of an embodiment of a method of these teachings.
Figure 15:
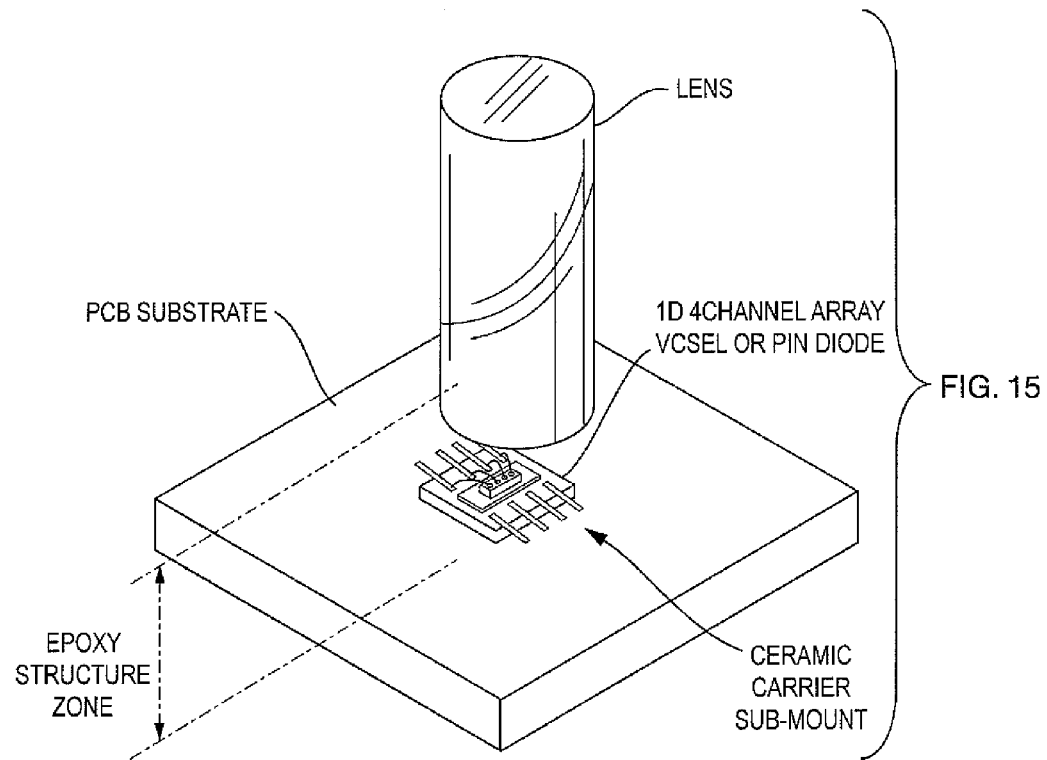
FIG. 15 is a detailed schematic of the packaging technique of FIG. 14.

One of the packaging embodiments includes the use of submounts to hold the die. These submounts are then mounted to the circuit boards. An advantage of this embodiment is that the die can be readily tested and replaced prior to mounting the die on the board. This embodiment is illustrated in FIG. 14. A more detailed illustration of this submount technique is illustrated in the ODP construction diagram in FIG. 15.

A 24 Channel Board-To-Board Link was designed and demonstrated. In addition to the multi-channel nature, flip-chip packaging techniques were developed and are discussed later. Separate transmit and receive modules were designed for the link. The transmit side utilized a flip-chip VCSEL array. This is a 5×5 Cartesian array of 850 nm VCSELs. The receive side of the link was fabricated from a custom designed, integrated detector/amplifier driver integrated circuit, also in a 5×5 Cartesian array.

Figure 16:
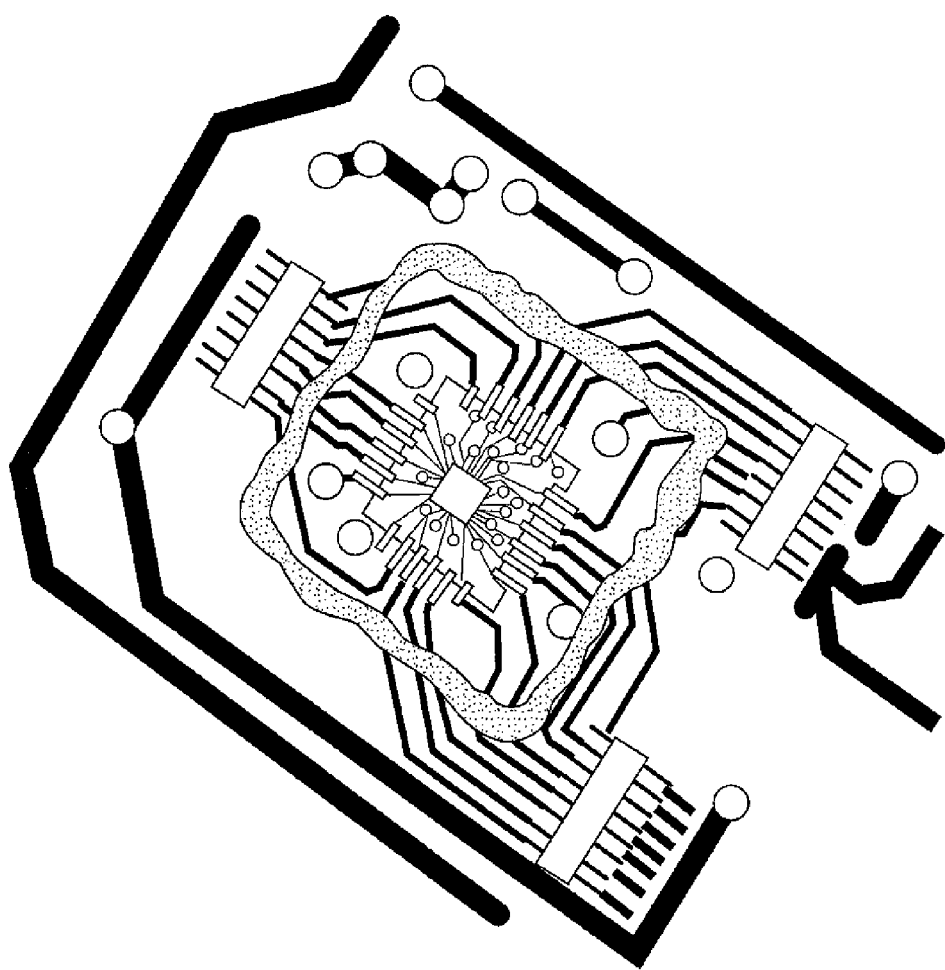
FIG. 16 is an illustration of a chip carrier on a populated circuit board of an embodiment of a system of these teachings.

A close-up view of a Flip-Chip Carrier on a PCB is shown in FIG. 16. The ceramic thin-film circuit flip-chip assembly is solder mounted to the test PCB. A ceramic interface carrier was needed because the feature sizes of the flip-chip electrical pads were too small for conventional PCB processing. Seen here is the latex dam 160 used to control the potting material during the lens mounting operation.

Figure 17:
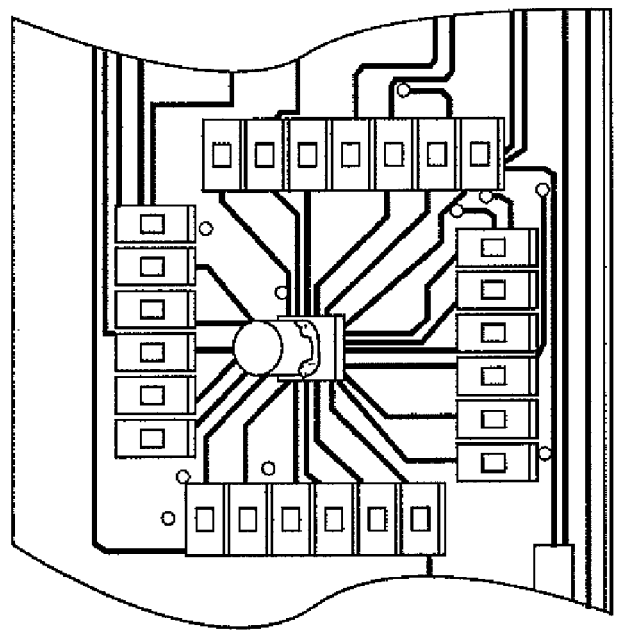
FIG. 17 is an illustration of a populated circuit board of an embodiment of a system of these teachings.

The transmit PCB is shown in FIG. 17. The 5×5 flip-chip VCSEL array test PCB shown was designed and fabricated to facilitate the control of the flip-chip VCSEL array. The PCB includes all power supplies, and drivers, and interconnects to a Digital I/O controller. There are 24 optical board-to-board channels. The 5×5 array has 25 VCSELs, however, the center one is used only for alignment and calibration purposes. The flip-chip and ASIC technologies are important for demonstrating the small footprint capability of the ODP technology.

Figure 18:
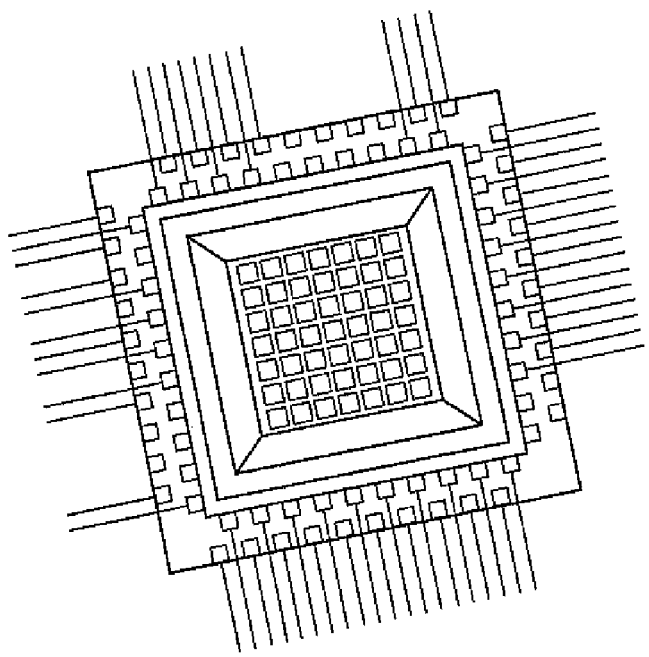
FIG. 18 is a close-up photographic illustration of a wirebonded ASIC receiver chip of an embodiment of a system of these teachings.

The close-up view of a wirebonded ASIC receiver Chip on its sub-carrier PCB is shown in FIG. 18. This is a chip-on-board assembly with gold plating on the PCB traces to facilitate wirebonding. The sub-carrier is used to facilitate a quick change for substitution of the different ASIC receiver versions into the test PCB. To keep power supply noise to a minimum, the bypass capacitors had to be mounted as close as possible to the die. This would have been much more difficult and expensive if done in a conventional ceramic wirebond package cavity. Note the 7×7 array of detector elements on the die. Only 24 channels are used because of the limited array size of the VCSEL flip-chip die.

Figure 19:
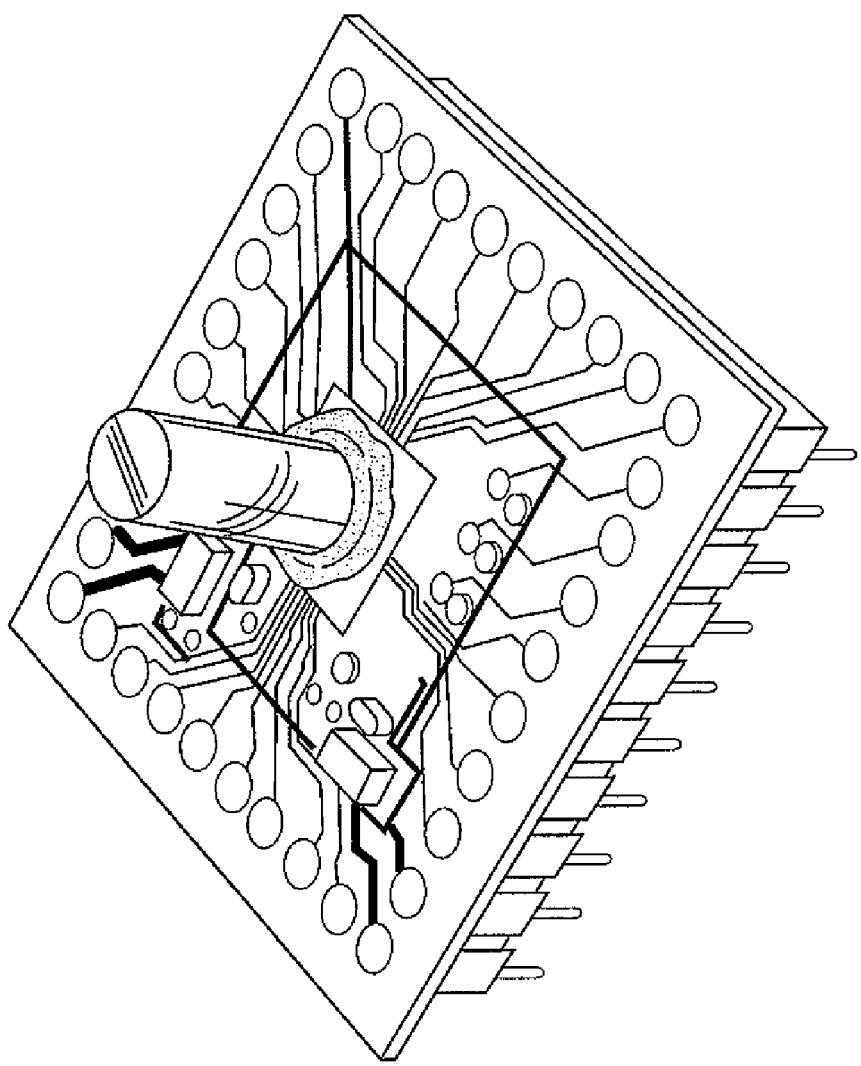
FIG. 19 is an illustration of an integrated receiver IC of an embodiment of a system of these teachings.

FIG. 19 shows the integrated receiver IC assembled onto its sub-carrier for ease of interchangeability. This photograph of the ASIC receiver ODP assembly including infinite conjugate imager shows the ASIC receiver chip mounted onto the sub-carrier PCB with a potted lens (4 mm diameter) in place. The bottom side pins mate into a ZIF (Zero Insertion Force) socket on the test PCB allowing for easy interchange of test chip types. This assembly is only 25 mm square.

Figure 20:
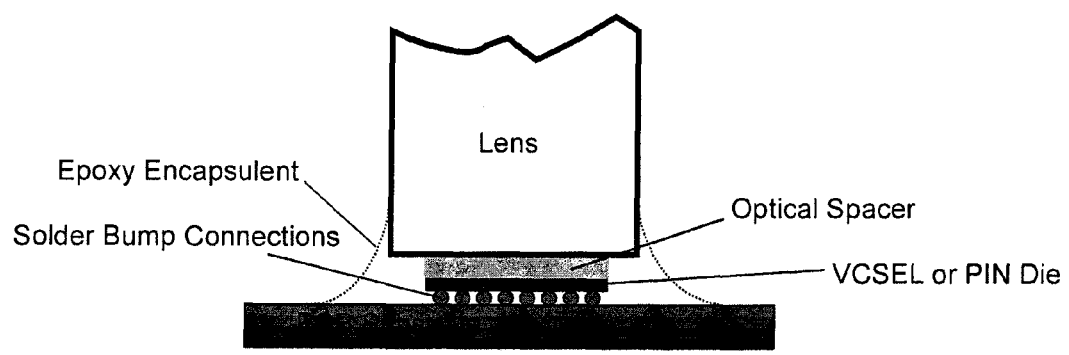
FIG. 20 is a schematic of an assembly of an embodiment of a system of these teachings.

One idealized assembly form shown in FIG. 20 has a very small foot print for a BB-ODP module mounted onto another primary circuit substrate. The multi-channel transmit flip-chip assembly shown in FIG. 20 is an idealized version of the WRI BB-ODP embodiment. In this embodiment a 2-D VCSEL (and/or detector) array die is solder bumped and flip chip mounted directly to a primary circuit substrate. The VCSELs are bottom emitting, meaning emitting from the bottom bumped surface through the die substrate. The optical spacer is optional. (The optical spacer is used to maintain the optical distance, e.g. back-focal distance, between the optical component and the die. Alternatively, a conventional spacer (s) may be used next to the die between the optical component and the circuit board to accomplish the same purpose. Such conventional spacer does not have to be transparent.))

Figure 21:
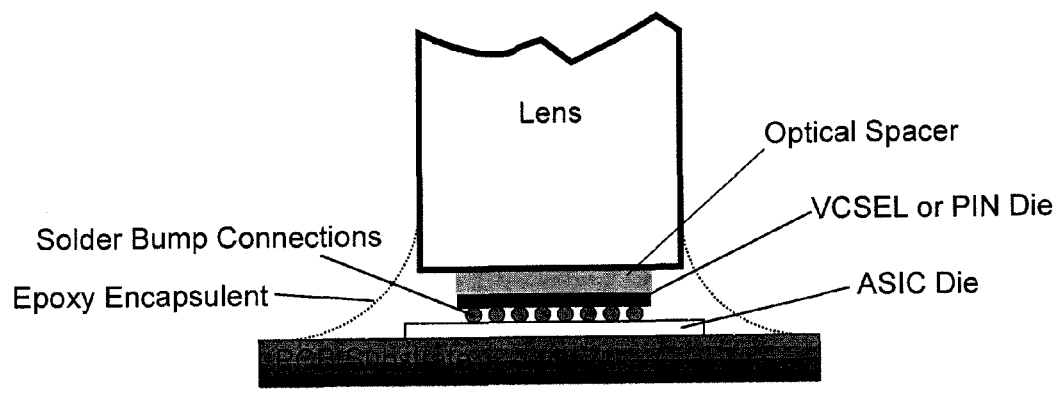
FIG. 21 is a schematic of an assembly of another embodiment of a system of these teachings.

Another embodiment, using an additional ASIC die for drive, receive, amplification, and thresholding etc. functions as necessary, is illustrated in FIG. 21. Flip-chip technology has been shown to be a reliable package interconnect methodology for compact ODP modules. For the receiver shown in FIG. 21, a detector array is flip chip mounted to the top side of the monolithic channel amplifier ASIC. The digitized outputs are then wirebonded to a primary circuit substrate. Ideally, the detector array will be integrated onto the ASIC to allow for a single solder-bumped die that can be placed under the lens as shown with the emitter module. Various options exist for this case, including vias connecting detectors on one side with circuits on the other, transparent or thinned substrates, etc.

Figure 22:
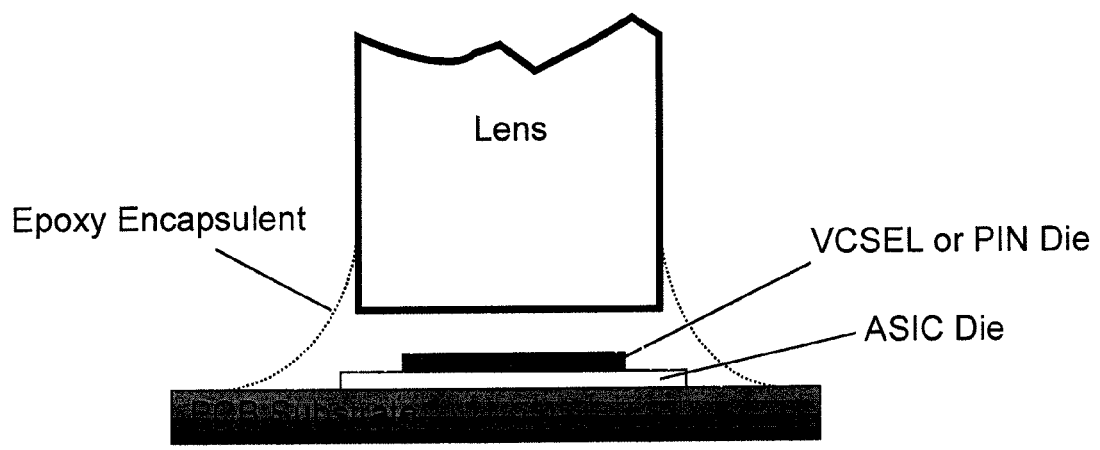
FIG. 22 is a schematic of an assembly of another embodiment of a system of these teachings.

These idealized assembly forms are however dependent upon the availability of the constituent components that are functional in a flip-chip mounted environment. An interim assembly strategy is to build modules with a more traditional chip and wire approach as outlined in FIG. 22. Die will be electrically connected with wirebonds. As is the case for the receiver module the detector array and ASIC die may be stacked or mounted side by side on the primary circuit substrate.

Practical aspects of the BB-ODP development were investigated including an initial look at the shock tolerance of the ODP modules. While these experiments are not formal quantitative testing, they demonstrated the initial ruggedness of the embodiments. As an initial step a sample unit was built and a series of drop tests were applied to generate shock pulses to the system. The potted lens assembly allows for active alignment of the lens with respect to the electro-optic components. The purpose of this rudimentary drop test is to ferret out any obvious structural weaknesses.

Figure 23:
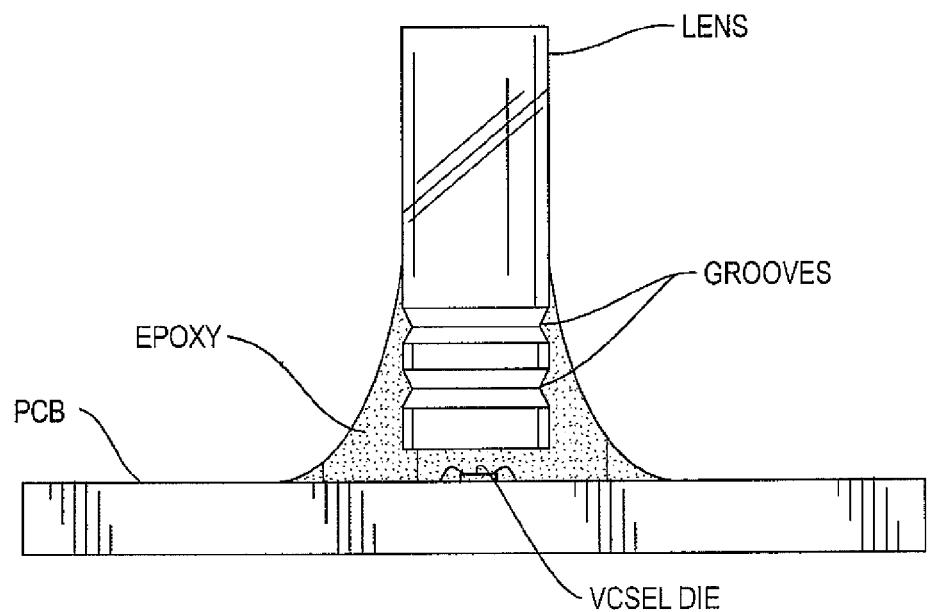
FIG. 23 is a schematic of a potted lens assembly of an embodiment of a system of these teachings.
Figure 24:
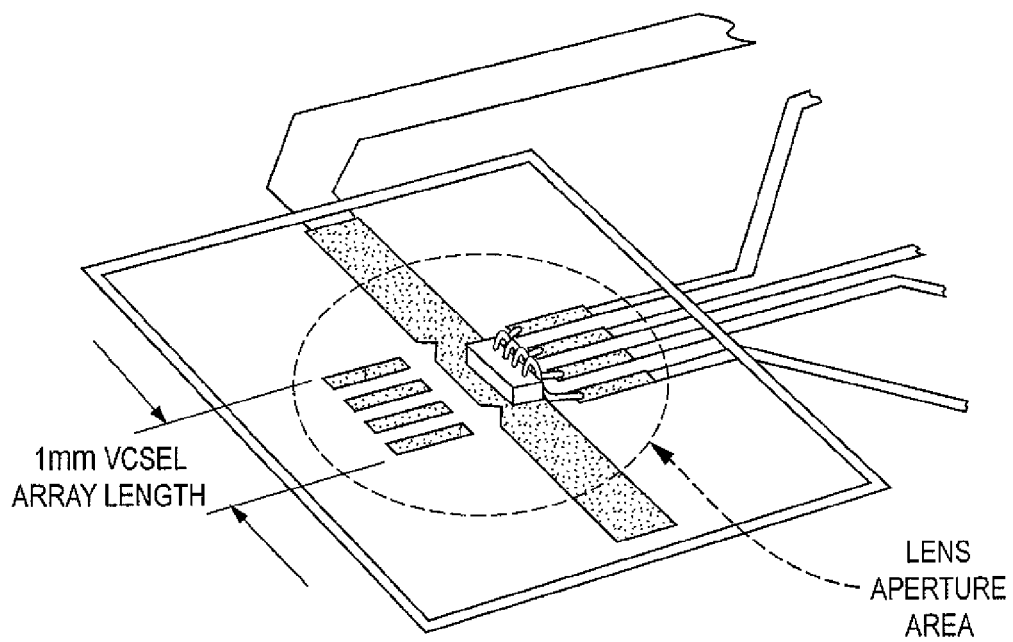
FIG. 24 is an illustration of a printed circuit board substrate of an embodiment of a system of these teachings.

The concept of the shock sample is illustrated in FIG. 23. FIG. 23 shows the basic construction of the WRI potted lens assembly used throughout the program effort. Samples of this construction were built for simple tests for robustness of the construction methodology. Basically, it consists of a chip-on-board, chip and wire assembly on a printed circuit board which is then encapsulated with an integral lens system. The function of the shallow grooves on the rod lens imager is to give the epoxy something to hold onto (as opposed to a smooth surface). Basically, the shock sample consists of a potted ODP using chip-on-board technology with a wirebonded die assembly on a standard FR-4 printed circuit board substrate. This substrate is shown in FIG. 24. The first step to a module build is die attach and wirebond operations. The die is attached with a conductive epoxy. The ultrasonic wirebond process uses 0.001" diameter gold wire. The attached 4 channel VCSEL array die shown in FIG. 4 is just 1 mm long×0.25 mm wide.

In the next step a 4 channel VCSEL array die is attached to the PCB metal circuit pattern via a silver filled, conductive epoxy which is then cured. Following die attachment, electrical interconnects from die contact pads to the PCB circuit trace pads are made using ultrasonic wirebonding with 1 mil (0.001") gold wire.

The lens attachment was accomplished by holding the lens in an aligned position as the area between the die and the lens surface was flooded with a UV curing, optical grade epoxy. Additional epoxy material was allowed to form a meniscus at the lower end of the lens rod. The assembly was then exposed to strong UV light source for a cure interval.

Figure 25:
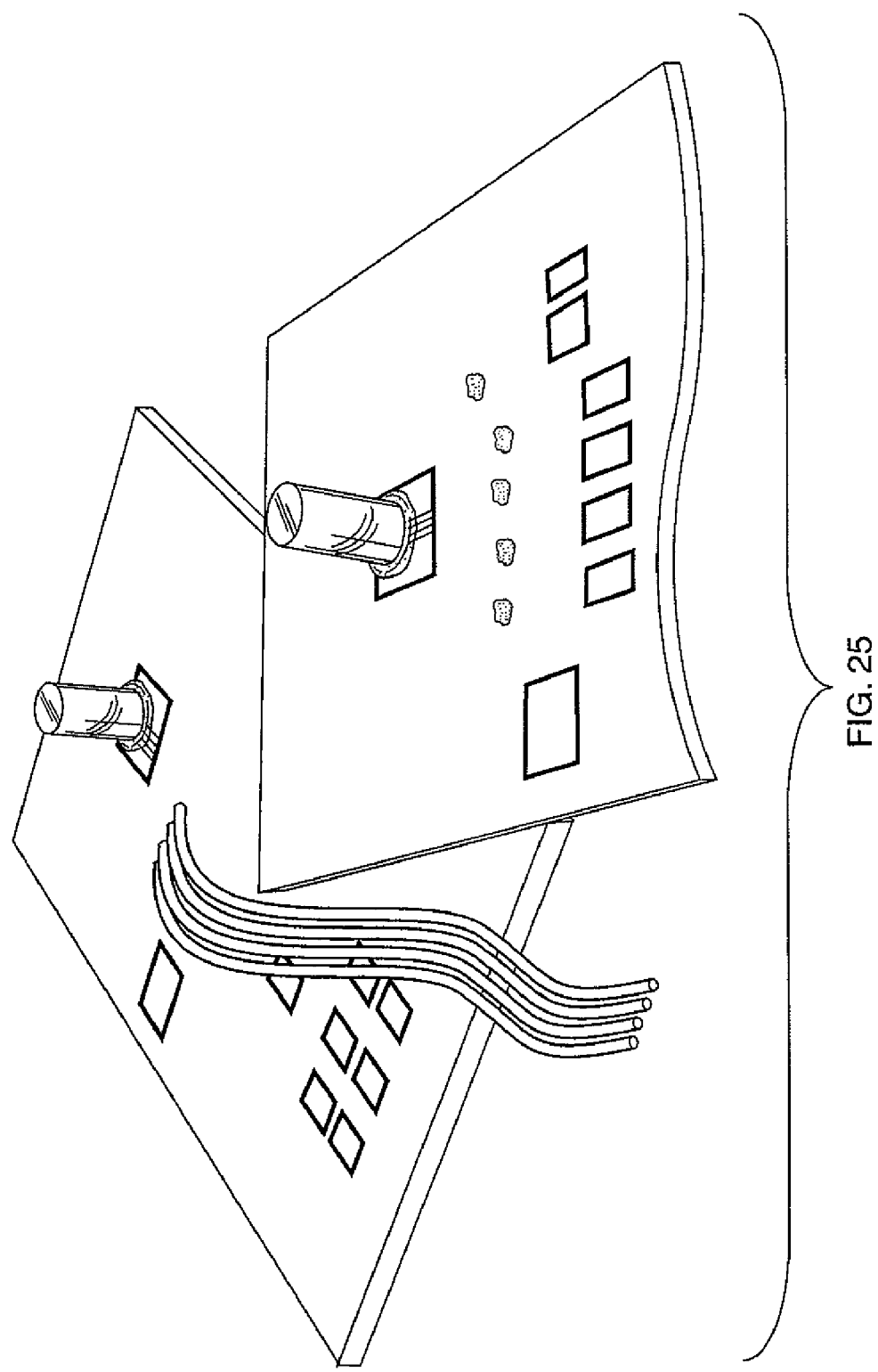
FIG. 25 is an illustration of two ODP accelerating test boards of an embodiment of a system of these teachings.

Two of the resulting ODP accelerating test boards are shown in FIG. 25. Two samples shown in FIG. 25 were fabricated for simple drop test experiments. The printed circuit boards onto which the lens assemblies are built do not serve a special purpose circuit wise. The PCBs are the industry standard FR-4 material.

Although the invention has been described with respect to various embodiments, it should be realized these teachings is also capable of a wide variety of further and other embodiments within the spirit and scope of the appended claims.

What is claimed is:

1. A method for providing a low footprint optical interconnect, the method comprising the steps of:
   bonding a transceiver die directly onto a circuit board;
   aligning and attaching an optical imaging component to the circuit board; the optical imaging component being disposed over the transceiver die and in optical communication with the transceiver die; a low footprint optical interconnect being obtained by affixing the optical imaging component directly to the board without the use of carriers for the optical imaging component.

2. The method of claim 1 wherein the optical component is an infinite conjugate imager.

3. The method of claim 2 wherein the infinite conjugate imager is a rod lens.

4. The method of claim one further comprising the step of:
   engraving a grid of lines to provide reference edges for die placement.

5. The method of claim 1 wherein the attaching the optical components comprises:
   applying epoxy potting material between the optical component and the circuit board.

6. The method of claim 1 wherein the step of bonding the transceiver die comprises the steps of:
   securing a sub-mount onto the circuit board; and
   mounting the transceiver die on to the sub-mount.

7. The method of claim 1 wherein the step of aligning and attaching the optical imaging component comprises the step of:
   providing a containing structure to contain potting material during optical imaging component attachment.

8. The method of claim 1 wherein the step of bonding the transceiver die comprises the steps of:
   providing a solder bump connection between the transceiver die and the circuit board.

9. The method of claim 1 further comprising the step of placing an optical spacer between the optical imaging component and the transceiver die.

10. The method of claim 1 wherein the step of bonding the transceiver die comprises the steps of:
    bonding an electronic components die on to the circuit board; and
    providing a solder bump connection between the transceiver die and the electronic component die; the transceiver die being mounted on top of the electronic component die.

11. The method of claim 1 wherein the step of bonding the transceiver die comprises the steps of:
    wire bonding an electronic component die onto the circuit board;
    mounting the transceiver die on top of the electronic component die; and
    wire bonding the transceiver die to the circuit board.

12. A product assembled by the process of claim 1.

* * * * *